(12) United States Patent
Wessendorf

(10) Patent No.: US 6,169,459 B1
(45) Date of Patent: Jan. 2, 2001

(54) ACTIVE-BRIDGE OSCILLATOR

(75) Inventor: Kurt O. Wessendorf, Albuquerque, NM (US)

(73) Assignee: Sandia Corporation, Albuquerque, NM (US)

( * ) Notice: Under 35 U.S.C. 154(b), the term of this patent shall be extended for 0 days.

(21) Appl. No.: 09/314,865

(22) Filed: May 19, 1999

(51) Int. Cl.[7] .............................. H03B 5/38; H03B 5/42
(52) U.S. Cl. ...................... 331/110; 331/116 R; 331/138; 331/139
(58) Field of Search ................. 331/110, 116 R, 331/116 FE, 117 R, 117 FE, 117 D, 138, 139, 158

(56) References Cited

U.S. PATENT DOCUMENTS

| | | | |
|---|---|---|---|
| 4,571,558 | * 2/1986 | Gay et al. ............................. | 331/105 |
| 4,661,785 | 4/1987 | Benjaminson ........................ | 331/109 |
| 5,034,706 | * 7/1991 | Betti et al. ......................... | 331/117 R |
| 5,416,448 | 5/1995 | Wessendorf ........................... | 331/116 |
| 5,434,543 | * 7/1995 | Brilka et al. ...................... | 331/117 R |
| 5,463,354 | * 10/1995 | Calder et al. .......................... | 331/65 |

* cited by examiner

*Primary Examiner*—David Mis
(74) *Attorney, Agent, or Firm*—George H. Libman

(57) ABSTRACT

An active bridge oscillator is formed from a differential amplifier where positive feedback is a function of the impedance of one of the gain elements and a relatively low value common emitter resistance. This use of the nonlinear transistor parameter h stabilizes the output and eliminates the need for ALC circuits common to other bridge oscillators.

12 Claims, 4 Drawing Sheets

ACTIVE-BRIDGE OSCILLATOR

The United States Government has rights in this invention pursuant to Department of Energy Contract No. DE-AC04-94AL85000 with Sandia Corporation.

CROSS REFERENCE TO RELATED APPLICATIONS (Not Applicable)

BACKGROUND OF THE INVENTION

The oscillator is one of the basic electronic circuits, and typically includes a semiconductor amplifier powered by a DC voltage and which has a feedback loop between the amplifier output and input to cause an AC output. There are many trade-offs for the oscillator designer, who must balance factors such as size, power requirements, and ease of manufacture with performance requirements such as waveform shape, amplitude stability and frequency stability.

The bridge oscillator is a known device having four impedances connected in a ring to form a four terminal bridge, with the two inputs of a differential amplifier connected to opposing terminals and the output of the amplifier and ground connected to the other opposing terminals. If a piezoelectric crystal is utilized as one of the impedances, the combination of positive and negative feedback loops can provide high circuit Q and thus produce very stable oscillation.

The standard bridge oscillator (SBO), and variations thereon, is discussed in some detail in U.S. Pat. No. 4,661,785 of Benjaminson. FIG. 1 of the Benjaminson patent shows a generic standard is recreated as FIG. 1 herein. The loop-gain equation for this oscillator is:

$$A = (\beta_p - \beta_n) A_v = 1 \angle 0° \quad (1)$$

where A is the loop-gain and $A_v$ is the gain of the amplifier. For oscillation A must equal 1. Also, positive feedback $\beta_p$ must be greater than negative feedback $\beta_n$ for the phase condition of oscillation to be met.

For the SBO of FIG. 1, $$\beta_p = R_2/(R_2+R_1) \text{ and } \beta_n = Z_{res}/(Z_{res}+R_f) \quad (1a)$$

where $Z_{res}$, the impedance of crystal resonator $Y_1$, is:

$$Z_{res} = R_m + jL_m\omega + \frac{1}{jC_m\omega} = R_m + j\frac{\omega^2 L_m C_m - 1}{\omega C_m} \quad (2)$$

where $R_m$, $C_m$, and $L_m$ are the motional parameters of the quartz resonator. Eq. (2) assumes that $R_m$ is much smaller than the reactive impedance of the resonator shunt capacitance, $C_0$. Using this assumption, $Z_{res}$ accurately describes the resonator impedance at frequencies near series resonance.

Since the SBO is a series resonant oscillator, $Z_{res}$ at series resonance is equal to $R_m$, the motional resistance of the resonator. Hence the negative feedback term at series resonance is:

$$\beta_n = R_m/(R_m+R_f) \quad (3)$$

If there is excess loop-gain and the loop-phase is zero, then the nonlinear properties of the gain stage will limit $A_v$ to a value commensurate with eq. (1).

The term $(\beta_p - \beta_n)$, as determined from eqs. (1a), contains all the frequency-dependent loop-phase information, as $\beta_n$ has a phase versus frequency function dependent upon the values of $R_f$ and $Z_{res}$. This frequency dependent vector is subtracted from a fixed real quantity, $\beta_p$. The resulting vector, $(\Theta^p - \beta_n)$, determines the oscillator loop-phase. As the magnitude of $\beta_p$ approaches $\beta_n$, with $\beta_p > \beta_n$, $d\theta/d\omega$ of the resulting vector is greater than $d\theta/d\omega$ of $\beta_n$. The penalty paid for this increased phase-rate vector is that the magnitude of this resulting vector decreases, requiring larger $A_v$ to sustain oscillation. Also, as the resulting vector becomes small, it is more prone to 1/f noise in the sustaining amplifier.

The circuit loop-phase shift relative to frequency ($\omega$) is adjustable by choosing the feedback ratios, $\beta_p$ and $\beta_n$, such that the desired loop Q is achieved. To determine the effect $\beta_p$ and $\beta_n$ have on $d\theta/d\omega$ of the loop-phase, an equation for the loop-phase versus $\omega$ is required. The loop-phase $d\theta/d\omega$ will be compared to the $d\theta/d\omega$ of resonator impedance ($Z_{res}$) phase to determine the relative loop Q. Let $M_Q$ be the ratio of the derivatives of oscillator loop-phase to resonator impedance phase with respect to $\omega$. $M_Q$ is a measure of the loaded Q of the oscillator in that Q can be equated to the derivative of phase change relative to $\omega$.

After an algebra exercise which is not necessary for an understanding of the invention, the expression for the magnitude of $M_Q$ is determined to be:

$$M_Q = (d(\theta_{Loop})/d\omega)/(d(\theta_{Resonator})/d\omega) = \left| \frac{(\beta_n - 1)(\beta_n)}{\beta_p - \beta_n} \right| \quad (4)$$

The aforementioned Benjaminson patent discloses a different value for $M_Q$ in eq. (27):

$$M_Q = \frac{\beta_n}{\beta_p - \beta_n} \text{ (Benjaminson)} \quad (5)$$

Eq. (5) was derived using the assumption that $\beta_n$ is proportional to $R_m$, which assumption is true only when $\beta_n << 1$. These facts explain and help verify the observation that eq. (4) is a general case solution for the bridge oscillator described in FIG. 1. These results have been verified with SPICE analysis and negative resistance modeling. For any further reference to $M_Q$, eq. (4) is the assumed definition.

Practical Realization of the SBO

FIG. 5 of the Benjaminson patent discloses a practical realization of an SBO, and is recreated as FIG. 2 herein. This SBO has some inherent shortcomings and does not well represent the ideal bridge oscillator depicted in the "block" schematic, FIG. 1. First, this design uses a high-impedance collector node (of 302) to drive the bridge network, although $\beta_n$ of the bridge may be a relatively low impedance. Another disadvantage with the SBO is that only the differential amplifier nonlinearities, h, control the amplitude of oscillation. As a transistor base-emitter ac voltage increases, so does the effective nonlinear value of intrinsic base-emitter impedance $h=1/g_m$, where $g_m$ is the transconductance of the device. For high $M_Q$ operation, the signals at each base are approximately the same amplitude. This means that the ac base-to-emitter voltages of the differential amplifier transistors are relatively small, even for large signals at each base. Therefore, large changes in amplitude result in only small changes in operating h. This means that the oscillation amplitude will vary greatly with respect to resonator resistance, temperature, etc. Therefore this circuit must be used with an automatic level control (ALC) circuit 320 which controls some element in the oscillator (bias or feedback component) continuously to maintain a desired signal amplitude.

An additional disadvantage is that the bridge oscillator typically utilizes a number of large value capacitors and inductors (such as the resonant circuit of CF and LF, and RFC 304) which makes it difficult to implement as an integrated circuit. For these and other reasons, bridge oscillators are typically not used in mainstream designs; rather, they are generally relegated to relatively low-volume, high-performance applications.

SUMMARY OF THE INVENTION

The active bridge oscillator (ABO) of this invention is a bridge-type oscillator design that is easy to design and overcomes many of the operational and design difficulties associated with standard bridge oscillator (SBO) designs. The ABO will oscillate with a very stable output amplitude over a wide range of operating conditions without the use of an automatic-level-control (ALC). It is also designed for implementation as an integrated circuit and can be designed for use over a very wide frequency range with only minor circuit variations. The ABO is a practical high-performance alternative to the SBO that delivers most of the performance advantages of a bridge oscillator without the inherent disadvantages of complexity, design difficulty, high-power requirements, and low integration potential.

To achieve the foregoing and other objects, and in accordance with the purpose of the present invention, as embodied and broadly described herein, the present invention may comprise an active bridge oscillator including a differential amplifier having an inverting input on a first gain device and a noninverting input on a second gain device, with each of the devices having a transconductance $g_m$ and inverting and noninverting outputs, and the non-inverting outputs being connected as a coupled pair. A signal conditioning circuit connects the inverting output of the first gain device to the noninverting input. The circuit includes a negative feedback path comprising a feedback resistance connected between the inverting and noninverting inputs, and a resonant circuit connected from the inverting input to ac ground; and a positive feedback path consisting of the intrinsic resistance $1/g_m$ of the gain devices and a relatively low ac resistance connected between said coupled pair and ac ground.

Additional objects, advantages, and novel features of the invention will become apparent to those skilled in the art upon examination of the following description or may be learned by practice of the invention. The objects and advantages of the invention may be realized and attained as particularly pointed out in the appended claims.

BRIEF DESCRIPTION OF THE DRAWINGS

The accompanying drawings, which are incorporated in and form part of the specification, illustrate an embodiment of the present invention and, together with the description, serve to explain the principles of the invention.

DETAILED DESCRIPTION OF THE INVENTION

Figure 3:
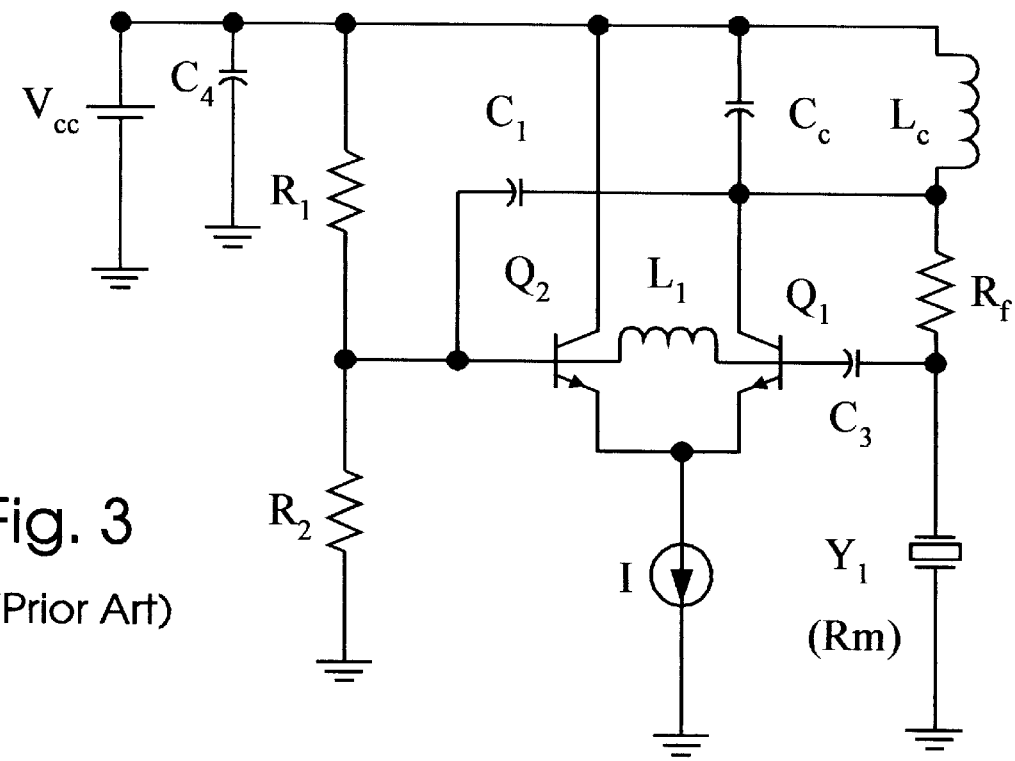
FIG. 3 shows a prior art half-bridge oscillator

The active-bridge oscillator (ABO) of this invention was conceived while modeling a half-bridge design as shown in FIG. 3 and discussed in detail in by (Kurt) Otto Wessendorf, U.S. Pat. No. 5,416,448. In the half-bridge design, $\beta_p$ is set to one ($C_1$ is chosen to be large; an ac short) and the oscillator uses only $\beta_n$ to control the loop operating Q. Although not extremely stable, the design is very practical and has good amplitude stability. While modeling very high-frequency versions of this design, the current source I was made non-ideal. In checking this model, relatively low-values of ac impedances were substituted for the disclosed high-impedance current source. This modeling suggested improved stability with low value real ac impedances placed from the emitters of $Q_1$ and $Q_2$ to ground. Subsequent analysis showed a bridge effect in that as this emitter impedance decreased, the half-bridge design turns into a full-bridge function where $\beta_p$ is now less than one. $\beta_p$ becomes a function of this emitter to ground impedance and the transistor h in this non-obvious bridge circuit.

Figure 4:
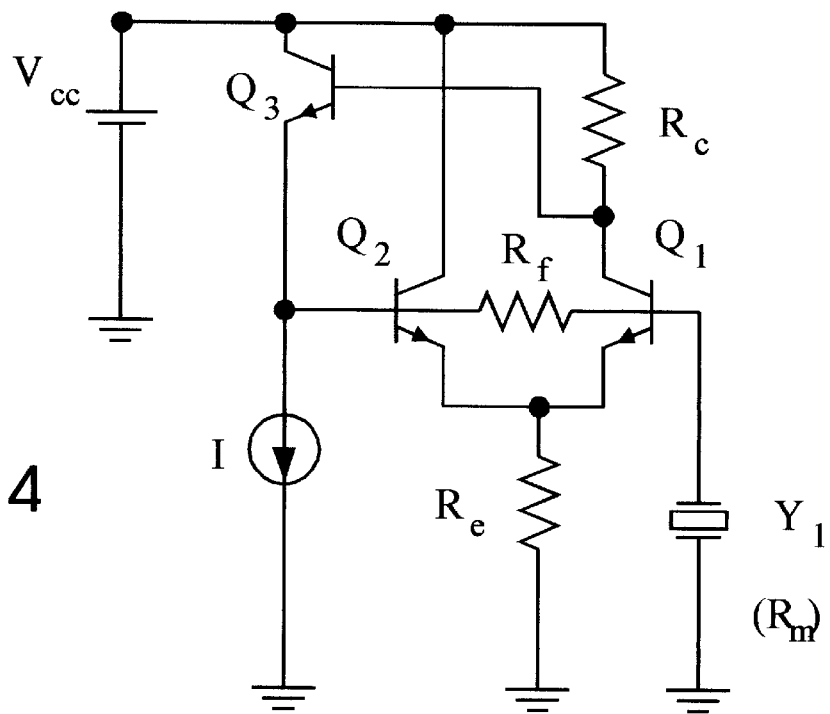
FIG. 4 shows a simplified ABO circuit.

FIG. 4 is a simplified active-bridge oscillator schematic of the invention. A differential amplifier includes a pair of common emitter transistors $Q_1$, $Q_2$, having their bases connected by a feedback resistor $R_f$ and their emitters connected to ground through $R_e$. The collector of $Q_1$ forms an inverting output for a signal at the base of $Q_1$ and is connected to power supply $V_{cc}$. A signal conditioning circuit includes a transistor $Q_3$ having a base connected to the collector of $Q_1$, a collector connected to $V_{cc}$ (a source of dc power and an ac ground) and an emitter connected to the base of $Q_2$. Resistor $R_c$ biases the base of $Q_3$, while an active current source or a resistor connects the emitter of $Q_3$ to ground.

The loop equations for the circuit of FIG. 4 may be derived by breaking the oscillator loop at the emitter of $Q_3$, base of $Q_2$ node and determining the loop-gain. This is a logical place to break the node and preserve the oscillator closed-loop characteristics because the emitter of $Q_3$ is low impedance, and the $\beta_p$ and $\beta_n$ functions remain intact. This circuit is designed with $Q_3$ used as an emitter follower to buffer the high impedance collector $Q_1$ from the low impedance $\beta_n$, and to serve as an output buffer. (The output is preferably taken from the emitter of $Q_3$.) $\beta_n$ is provided by $R_f$ and $Y_1$, where $Y_1$ is equal to $R_m$ at $\omega_s$. $R_f$ also supplies dc bias to the bases of $Q_1$ and $Q_2$ because $R_f$ is typically a relatively low value resistor, at most hundreds of ohms. Most significantly, the intrinsic base-emitter impedance $h=1/g_m$ of the transistors $Q_1$ and $Q_2$ provide the $\beta_p$ function when $R_e$ is a low value resistor, on the same order of magnitude as h (tens of ohms ac). Hence the name: active-bridge oscillator.

The ABO of FIG. 4 has some design flexibility. The differential amplifier may comprise any active gain devices that have inverting and noninverting outputs, where the noninverting outputs can be connected as a coupled pair equivalent to the shared emitter pair of FIG. 4. Such devices include vacuum tubes, FETs, and either NPN or PNP transistors. Furthermore, each transistor may be replaced with a Darlington pair or other equivalent circuitry. However, $Q_1$ should be nearly identical to $Q_2$, and preferably the transconductance of $Q_1$ and $Q_2$ should be of similar value.

It should also be understood that the noninverting outputs of a coupled pair may have some impedance between them. For example, they may be connected to each other and ac ground with a resistive pi or other circuit so the transistors could also be individually biased by separate resistors, as is well known in the art, so long as they function as a coupled pair in the manner of a differential amplifier. Furthermore, the ac impedance between each emitter and ac ground must be no larger than a value on the same order of magnitude as the intrinsic impedance h of the gain devices, or under about 100 ohms for a bipolar transistor. This resistance value is considerably lower than the normal ac impedance between emitters and ground of a standard bridge oscillator, and it enables the transistor base-emitter impedance h to be an important factor in the positive feedback, as set forth herein. This maximum value would increase to about 1000 ohms for an FET amplifier, as the transconductance of an FET is about 10 times lower than the transconductance of a transistor.

Furthermore, since the primary purpose of feedback transistor $Q_3$ is impedance matching, it could be replaced by a suitable transformer or other device. However, an active semiconductor device such as transistor $Q_3$ is the easiest device to implement in the preferred integrated circuit embodiment of the invention.

The loop gain for the ABO was found to fit the form of a bridge oscillator function, eq. (1), with the following characteristics. For simplicity these equations assume relatively large transistor β.

$$A_v = \frac{R_c}{h + (hR_e/(R_e + h))} \quad (12)$$

$$\beta_n = R_m/(R_m + R_f) \quad (13)$$

$$\beta_p = R_e/(R_e + h) \quad (14)$$

$\beta_p$ and $A_v$ are functions of h and $R_e$. In this circuit, as $R_e$ is decreased (increasing $M_Q$), $A_v$ is increased. Since increasing $M_Q$ requires a larger $A_v$ to sustain oscillation, this characteristic is desirable from a current efficiency standpoint.

Figure 5:
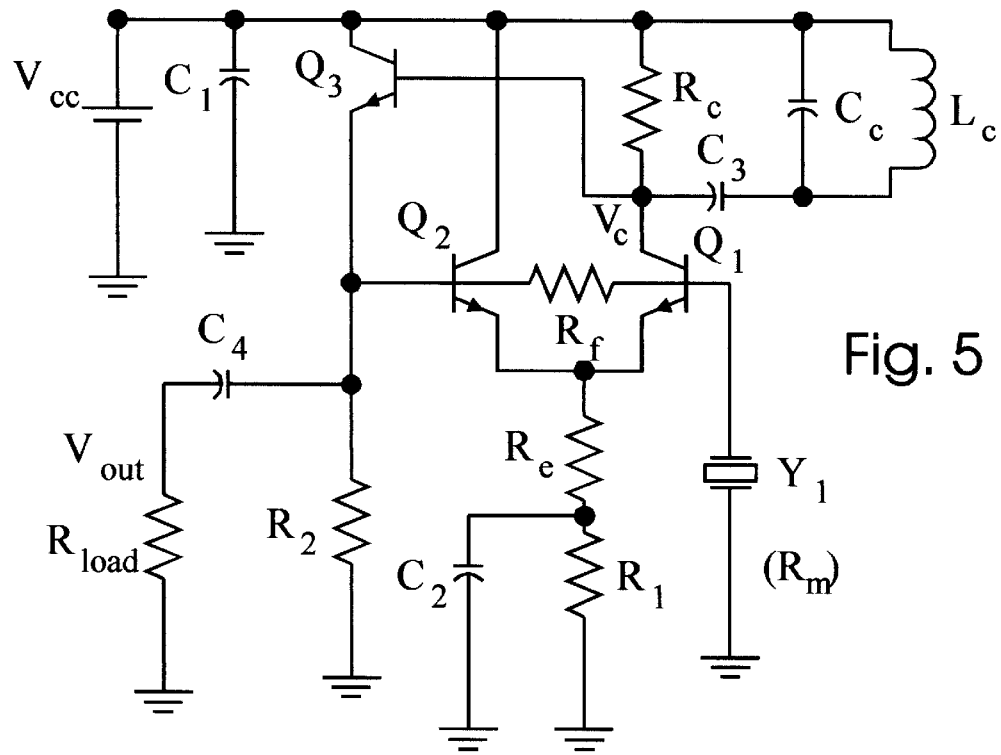
FIG. 5 shows a practical ABO circuit.

FIG. 5 is a preferred embodiment of the ABO with consideration given to bias and filtering necessities. Capacitors $C_3$ and $C_4$ function as dc blocks and ac shorts. $R_e$, $R_1$ and $C_2$ facilitate dc biasing and provide an ac ground. $R_e$ is a low value, typically <100 Ω, and $R_1$ is a bias resistor typically set from 1 kΩ to 2 kΩ. The bias voltages in the circuit are therefore primarily determined by $V_{cc}$, transistor $V_{be}$, $R_1$ and $R_c$.

Eq. (15) is the dc bias equation for the dc voltage $V_c$ of FIG. 5 relative to ground. This equation is valid only when the circuit is not oscillating, as oscillation causes significant bias shifting in the circuit. $V_c$ is the dc voltage at the collector of $Q_1$ when $R_e$ is much less than $R_1$.

$$V_c = \frac{V_{cc} + 2V_{be}(R_c/2R_1)}{1 + (R_c/2R_1)} \quad (15)$$

If $R_c = R_1$, which is a convenient and practical design possibility for this circuit, and $R_e << R_1$, eq. (15) simplifies to:

$$V_c = \frac{V_{cc} + V_{be}}{1.5} \quad (16)$$

The emitters of the differential amplifier ($Q_1$, $Q_2$) will be biased at two $V_{be}$ drops down from $V_c$ due to the base-emitter drop of $Q_3$ and $Q_2$. $R_2$ sets the bias current in $Q_3$. The dc voltage at the base Of $Q_2$ is simply $V_c-V_{be}$. Therefore the bias current for $Q_3$ is $(V_c-V_b)/R_2$. This bias scheme works nicely in that it is very simple yet biases all transistors simultaneously at reasonable voltages and currents.

In this preferred embodiment, the signal conditioning circuit further includes a tank circuit, $L_c-C_c$, that performs several functions. First, for efficient use of current and a high available $A_v$, the collector resistor $R_c$ is chosen to be relatively large. Any significant circuit capacitance at this node will make the phase of the collector impedance a negative phase angle. For proper circuit operation, all feedback terms and $A_v$ need to be real. The tank, $L_c-C_c$, allows for $A_v$ to be made real at any desired frequency. Secondly, this tank significantly reduces the distortion in the output waveform by shunting the undesired harmonics of the oscillator to ground. Also, this tank naturally selects the desired resonator overtone. Overtone operation at $f_s$ is as easily achieved as fundamental mode operation.

Due to the predominately resistor-transistor based construction of this design, an analog application specific integrated circuit (ASIC) would allow for a very small oscillator circuit that provides ease of design and high-performance over a wide range of operating frequencies. Reasonable values for an ABO when $R_m=20$ Ω are: $R_c=R_1=1.5k\Omega$, $R_e=75\Omega$, $R_f=100$ Ω and $R_2=400$ Ω. $L_c$ and $C_c$ are chosen to be parallel resonant and approximately 100 to 150 Ω of reactive impedance. This results in an oscillator with high operating Q, low-distortion and a low-output drive at $Q_3$. This oscillator designed for 20 MHz operation delivers approximately -2 dBm into a 50 Ω load. The waveform is a very low distortion ($2^{nd}$ harmonic -30 dBc) sine wave. This circuit required approximately 10 mA of current when designed for a dc voltage $V_{cc}$ of 5 V. $Q_3$ is the major power consuming component in that its bias is relatively high so it can drive the low impedance $R_f$ and $R_{load}$. Typically, only $L_c$, $C_c$, $C_3$, $C_2$ and $C_1$ are large components that must be added externally to an integrated circuit.

Active-Bridge Nonlinearities

Due primarily to two factors, the ABO steady-state, large-signal oscillation amplitude is relatively independent of resonator resistance, changes in power supply voltage $V_{cc}$, and temperature changes. First, the steady-state base signals on the differential amplifier transistors $Q_2$, $Q_1$ of the ABO are not very similar in amplitude as they are in a SBO. The base signal of $Q_2$ is the same amplitude as the collector signal at $Q_1$. However, the base of $Q_1$ is being driven by a fraction ($\beta_f$) of the collector of $Q_1$. This allows the individual transistor h to be a strong function of signal amplitude: as the oscillation amplitude increases, h increases. Secondly, the $\beta_p$ term of the ABO is a strong function of oscillation amplitude: $\beta_p = R_e/(R_e+h)$ where h is the nonlinear transistor-impedance term. As a result, the oscillation amplitude is relatively stabilized by the circuit $M_Q$ via transistor h. Slight changes in the circuit parameters, such as resonator resistance, do not effect the oscillation amplitude greatly.

These characteristics are useful in that the ABO does not require an ALC for low distortion, large-signal, consistent amplitude, sinusoidal outputs.

Figure 6:
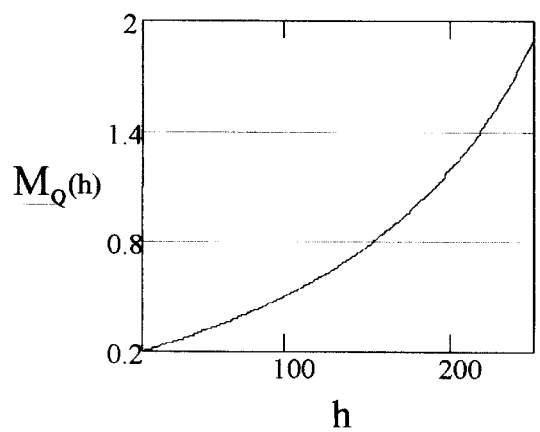
FIG. 6 shows the loaded Q of the ABO as a function of transistor h.

FIG. 6 is a graph of a calculated $M_Q$ versus transistor h for the following ABO design: $R_c=1100$ Ω, $R_f=105$ Ω, $R_m=20$ Ω $R_e=75$ Ω. Thus $\beta_n$ calculates to 0.160. Using eq. (1), the oscillator feedback and $A_v$ terms, and eqs. (12), (13), and (14), the steady-state value for h was calculated to be 143 Ω. Therefore $A_v=5.6$, $\beta_p=0.338$ and $M_Q$ calculates to 0.753.

Figure 7:
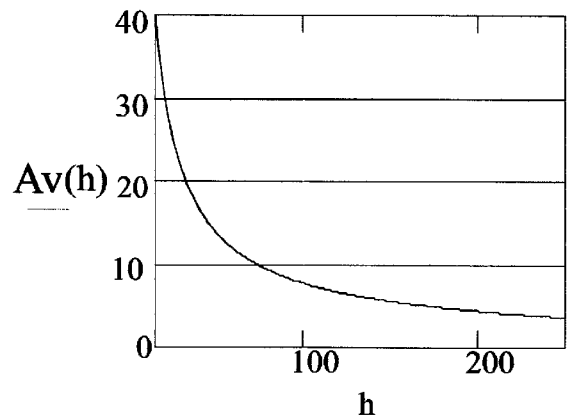
FIG. 7 shows the amplifier gain as a function of transistor h for the ABO.

FIG. 7 is a graph of $A_v$ vs. h for the ABO of FIG. 5. This graph shows that $A_v$ is decreasing with increasing h. It can also be seen in this graph that $A_v$ is 5.6 at h=143 Ω. This value of $A_v$ is the steady state gain.

To demonstrate the interdependence of $A_v$, the feedback terms of this ABO circuit were held constant and the resonator resistance allowed to vary slightly. When the resonator resistance, $R_m$ increases from 20 Ω from 25 Ω, the oscillation amplitude decreases just enough to obtain a new steady-state value of h that satisfies the loop-gain eq. (1). In this case h=134 Ω and the resulting $M_Q$, feedback terms, and $A_v$ are: $M_Q$=0.936$\beta_p$=0.358, $\beta_n$=0.192 and $A_v$=6.02. Note that $\beta_p$ changes from 0.338 to 0.358 for $R_m$ going from 20 Ω to 25 Ω. $M_Q$ changes by 24.3% for this 5 Ω change in $R_m$. This relatively small change in $M_Q$ is due to $\beta_p$ increasing with $\beta_n$ via the change in transistor h.

Figure 1:
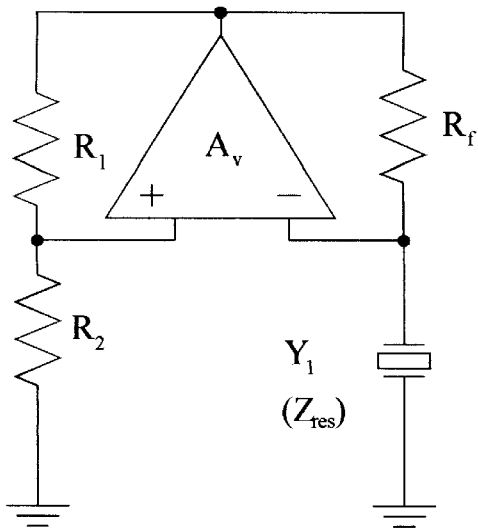
FIG. 1 shows a simplified prior art SBO circuit.
Figure 2:
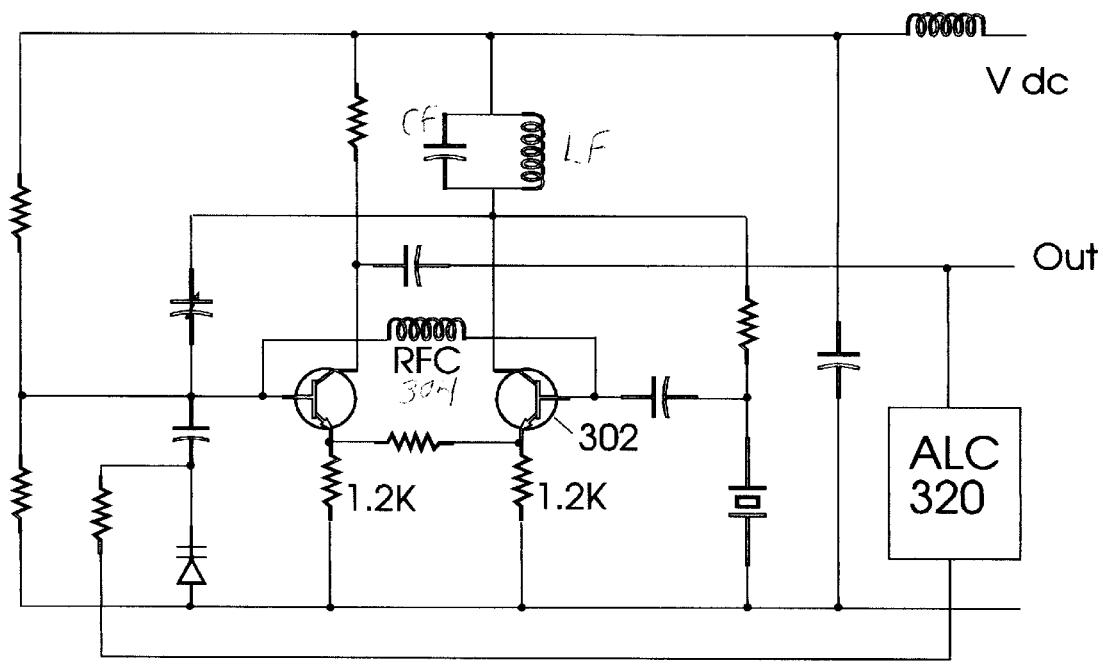
FIG. 2 shows a practical prior art SBO circuit.

An SBO (FIG. 2) was compared to the ABO (FIG. 5) with the same feedback parameters and resonator $R_m$ varying from 20 Ω to 25 Ω. In addition, $\beta_p$=0.358, $R_f$=105 Ω, and $R_c$=1100 Ω, and the collector impedance ($Q_1$) was assumed to be buffered by a transistor (as in the ABO) such that the $A_v$ for the hypothetical SBO was $R_c$/2h. This allows a fair comparison of the two designs in that both circuits now buffer the bridge-network from the high impedance collector node. In the SBO, the result is that for an $R_m$ change of 20 Ω to 25 Ω, $M_Q$ goes from 0.7534 to 1.0632, a 41% change. Transistor h goes from 98.12 Ω to 80.35 Ω. The percentage change in h required by the SBO to absorb this change in $R_m$ is approximately six times greater than for the ABO. $M_Q$ for the ABO is more stable over this change in $R_m$ than an SBO. Also, since the "amplitude versus h" function is much steeper with the ABO than an SBO (as previously described), the ABO amplitude stability is much greater than that of an SBO.

When these two oscillators were built and evaluated for $R_m$ varying from 20 Ω to 25 Ω, the SBO oscillation-amplitude changed 33%, and the ABO amplitude changed only 5%.

ABO with Class-AB Follower Stage

Figure 8:
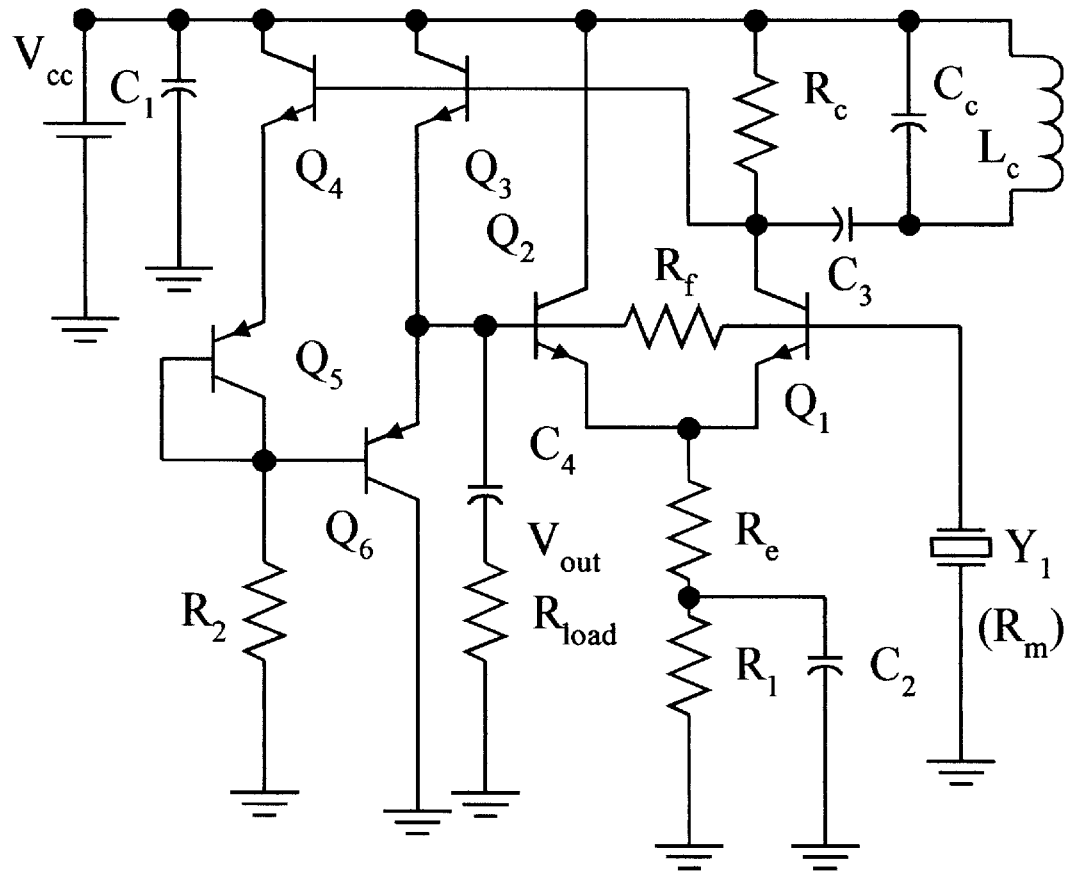
FIG. 8 is an alternative embodiment of an ABO.

If the ABO is designed for a large value $R_{load}$ and or a $R_f$ impedance, the dc current required by the circuit to perform the desired function can be relatively low. To increase the oscillator power-efficiency for low-values of $R_f$ and $R_{load}$, the class-A, non-efficient emitter follower, $Q_3$, may be replaced with a more current efficient class-AB follower as shown in FIG. 8. The class-AB stage consists of $Q_3$, $Q_4$, $Q_5$, $Q_6$ and a bias resistor $R_2$. The bias established by $R_2$ is mirrored in $Q_4$ and $Q_3$. Because of the push-pull action provided by the PNP-NPN output stage, this class-AB stage significantly decreases the dc bias required to swing large signals through low-impedance loads and greatly increases the overall power efficiency of the ABO. The earlier design example required approximately 10 mA of supply current for approximately −2 dBm output power. The same design implemented with this approach, at 20 MHz, required 5 mA for the same output power at $R_{load}$=50 Ω with circuit $R_2$=2.6 kΩ and the idle current in the output transistors being 1 mA. This circuit is also highly integratable and can operate to high-frequencies.

Active-Bridge Experimental Data

The ABO of FIG. 8 was used to verify the ABO loop equations for $M_Q$. For this experiment $R_c$=1100 Ω, $R_1$=1500 Ω, $R_f$=105Ω, $R_m$=20 Ω, $R_{load}$=200 Ω. $R_c$ was actually 1500 Ω but due to tank-loading and the finite impedance of the buffer, $R_c$=1100 Ω was used for the calculations. A 20 MHz resonator $Y_1$ was used for this test. The circuit $M_Q$ was varied by changing $R_e$ from 35 Ω to 75 Ω. The $M_Q$ was determined by measuring the frequency shift of the oscillator when a small capacitor, 1 pF, shunted the collector load of $Q_1$. This added capacitance places a small, known, phase-shift into the loop. Measuring the frequency shift required to accommodate the collector phase-shift measures the resonator phase-shift. These two phase-shifts allow for a determination of $M_Q$. The collector phase-shift for a 1 pF delta capacitance across $R_c$ is approximately 7°. The resonator phase-slope measured 114.3 m° /Hz, near series resonance. Therefore:

$$M_Q \text{ measured} = (7°/\Delta FreqOsc)/114.3 \text{m}°/\text{Hz},$$

where ΔFreqOsc is the frequency shift of the oscillator due to a 1 pF capacitance placed in parallel with the collector tank of $Q_1$. Table 1 displays the results of the described experiment.

TABLE 1

Data table for the $M_Q$ experiment of the ABO of FIG. 11.

| $R_e$ | $M_Q$ measured | $M_Q$ calculated |
| --- | --- | --- |
| 35 Ω | 1.33 | 1.23 |
| 51 Ω | 1.13 | 0.957 |
| 75 Ω | 0.87 | 0.75 |

These data demonstrate that the loop-phase indeed can be made steeper than the resonator slope, when $R_e$ equals 35 Ω. This data also demonstrates how well the large signal operation of the design can be predicted from the derived equations which are large signal approximations using small signal parameters, h. The oscillation amplitude decreased approximately 40% for $R_e$ going from 75 Ω to 35 Ω. This is very good performance considering the $M_Q$ varies approximately 53% for this range of $R_e$.

Conclusions

This design is both practical, and in many ways an excellent general use oscillator that is good for high-stability applications at most any frequency that quartz resonators are constructed. ABO designs have been implemented easily with 125 MHz fifth overtone resonators or with fundamentals from 5 MHz to 200 MHz with essentially the same design. With high $f_t$ transistors or ASIC implementations, higher frequencies could easily be achieved.

Another significant advantage of the ABO is that it operates with the resonator at series resonance. This is a distinct advantage at high-frequencies where manufacturing resonators tuned to $f_s$ is easier and more consistent than when tuned to a given load capacitance. This is true because the ill effects of the resonator $C_0$ (shunt capacitance) are minimized with $f_s$ tuning. At $f_s$ the resonator is near a local low-impedance point which is relatively easy to measure and not very dependent on the value of $C_0$.

The ABO also produces a low-distortion sine wave output into low impedances with no additional filtering or buffering. Very efficient low-current designs are possible with the ABO using the class-AB follower. With $V_{cc}$ as low as 3 Volts designs drawing 2 mA at 20 MHz were easily achieved. The bias arrangement and nonlinear properties of the ABO allow operation over a wide temperature range with little or no amplitude variations. The design uses a grounded resonator which greatly simplifies the design of VCOs (voltage controlled oscillator) or TCXOs (temperature compensated crystal oscillator) that require some form of "pulling" circuitry such as varactor networks. The phase-noise and overall oscillator stability of the ABO is superior to the more conventional Pierce or Colpitts oscillators due to the low operating $M_Q$ of those designs and the effect of transistor nonlinearities on oscillator performance. The overall performance and design flexibility make this design a nearly "universal" design that can be used for many applications and frequencies.

The particular sizes and equipment discussed above are cited merely to illustrate a particular embodiment of this invention. It is contemplated that the use of the invention may involve components having different sizes and shapes as long as the principles disclosed and claimed herein are followed. It is intended that the scope of the invention be defined by the claims appended hereto.

What is claimed is:

1. An active bridge oscillator comprising:

a differential amplifier having an inverting input on a first gain device and a noninverting input on a second gain device, said devices each having a transconductance $g_m$ and inverting and noninverting outputs, said noninverting outputs being connected as a coupled pair;

a signal conditioning circuit connecting the inverting output of said first gain device to the noninverting input;

a negative feedback path comprising a feedback resistance connected between said inverting and noninverting inputs, and a resonant circuit having a series resistance connected from said inverting input to ac ground;

a positive feedback path consisting of the intrinsic resistance $1/g_m$ of the gain devices and a relatively low ac resistance connected between said coupled pair and ac ground, the magnitude of said resistance being on the order of the sum of $1/g_m$ of both gain devices.

2. The active bridge oscillator of claim 1 wherein said gain devices are transistors.

3. The active bridge oscillator of claim 2 wherein said low ac resistance is less than 100 ohms.

4. The active bridge oscillator of claim 1 wherein said gain devices are FETs.

5. The active bridge oscillator of claim 4 wherein said low ac resistance is less than 1000 ohms.

6. The active bridge oscillator of claim 1 wherein said signal conditioning circuit comprises:

a third gain device having an input connected to the inverting output of said first gain device, a noninverting output connected to the input of said second gain device, and an inverting output connected to ac ground; and a second resonant circuit connected between the inverting output of said first gain device and ac ground.

7. The active bridge oscillator of claim 6 wherein said gain devices are transistors.

8. The active bridge oscillator of claim 6 wherein said second resonant circuit is a parallel LC circuit.

9. The active bridge oscillator of claim 6 wherein the magnitude of said relatively low ac resistance is on the order of the sum of $1/g_m$ of said first and second gain devices.

10. The active bridge oscillator of claim 9 wherein said gain devices are transistors and said relatively low ac resistance is less than 100 ohms.

11. The active bridge oscillator of claim 6 wherein said third gain device comprises a class AB amplifier.

12. An active bridge oscillator comprising:

a differential amplifier having an inverting input on a first gain device and a noninverting input on a second gain device, said devices each having a transconductance $g_m$ and inverting and noninverting outputs, said noninverting outputs being connected as a coupled pair;

a signal conditioning circuit connecting the inverting output of said first gain device to the noninverting input;

a negative feedback path comprising a feedback resistance $R_f$ connected between said inverting and noninverting inputs, and a resonant circuit having a series resistance $R_m$ connected from said inverting input to ac ground, wherein said negative feedback ratio $\beta_n$ is a function of $R_f$ and $R_m$;

a positive feedback path consisting of the intrinsic resistance, $1/g_m$, of the gain devices and an ac resistance $R_e$ having a magnitude on the order of the sum of $1/g_m$ of both gain devices connected between said coupled pair and ac ground, wherein said positive feedback ratio $\beta_p$ is a function of $R_e$ and $1/g_m$, and $\beta_n < \beta_p < 1$.

* * * * *